United States Patent
Epler et al.

(10) Patent No.: US 10,147,843 B2
(45) Date of Patent: Dec. 4, 2018

(54) SEMICONDUCTOR LIGHT EMITTING DEVICE INCLUDING A WINDOW LAYER AND A LIGHT-DIRECTING STRUCTURE

(75) Inventors: John Epler, San Jose, CA (US); James G. Neff, Felton, CA (US); Oleg B. Shchekin, San Francisco, CA (US)

(73) Assignee: LUMILEDS LLC, San Jose, CA (US)

( * ) Notice: Subject to any disclaimer, the term of this patent is extended or adjusted under 35 U.S.C. 154(b) by 1235 days.

(21) Appl. No.: 12/178,902

(22) Filed: Jul. 24, 2008

(65) Prior Publication Data
US 2010/0019260 A1  Jan. 28, 2010

(51) Int. Cl.
| | |
|---|---|
| *H01L 33/00* | (2010.01) |
| *H01L 33/16* | (2010.01) |
| *H01L 33/10* | (2010.01) |
| *H01L 33/22* | (2010.01) |
| *H01L 33/38* | (2010.01) |
| *H01L 33/50* | (2010.01) |
| *H01L 33/58* | (2010.01) |

(52) U.S. Cl.
CPC .......... *H01L 33/0079* (2013.01); *H01L 33/16* (2013.01); *H01L 33/10* (2013.01); *H01L 33/22* (2013.01); *H01L 33/38* (2013.01); *H01L 33/50* (2013.01); *H01L 33/58* (2013.01); *H01L 2924/0002* (2013.01); *H01L 2933/0083* (2013.01)

(58) Field of Classification Search
CPC ...................................... H01L 33/16
USPC ....... 257/79, 676, 98, E25.032, 99, E33.067, 257/E33.068, E33.069, E33.07, E33.071, 257/E33.072, E33.073, E33.074
See application file for complete search history.

(56) References Cited

U.S. PATENT DOCUMENTS

| | | | |
|---|---|---|---|
| 5,376,580 A | 12/1994 | Kish et al. | |
| 6,995,030 B2 | 2/2006 | Illek et al. | |
| 7,012,279 B2 * | 3/2006 | Wierer, Jr. et al. | 257/94 |
| 7,041,529 B2 | 5/2006 | Yamada et al. | |
| 7,119,372 B2 * | 10/2006 | Stokes et al. | 257/79 |
| 7,256,483 B2 * | 8/2007 | Epler et al. | 257/676 |

(Continued)

FOREIGN PATENT DOCUMENTS

| | | |
|---|---|---|
| CN | 1851886 A | 10/2006 |
| EP | 1705764 A1 | 9/2006 |

(Continued)

OTHER PUBLICATIONS

Decision of Rejection, China Application No. 200980128853.0, dated Nov. 25, 2013, 17 pages.

(Continued)

*Primary Examiner* — Hsin-Yi Hsieh
(74) *Attorney, Agent, or Firm* — Volpe and Koenig, P.C.

(57) ABSTRACT

A device includes a semiconductor structure comprising a light emitting layer disposed between an n-type region and a p-type region. The semiconductor structure is disposed between a window layer and a light-directing structure. The light-directing structure is configured to direct light toward the window layer; examples of suitable light-directing structures include a porous semiconductor layer and a photonic crystal. An n-contact is electrically connected to the n-type region and a p-contact is electrically connected to the p-type region. The p-contact is disposed in an opening formed in the semiconductor structure.

14 Claims, 2 Drawing Sheets

(56) References Cited

U.S. PATENT DOCUMENTS

| | | | |
|---|---|---|---|
| 7,361,938 B2* | 4/2008 | Mueller et al. | 257/94 |
| 7,462,502 B2* | 12/2008 | Paolini et al. | 438/22 |
| 7,553,683 B2* | 6/2009 | Martin et al. | 438/29 |
| 7,560,294 B2 | 7/2009 | Suehiro et al. | |
| 7,800,122 B2* | 9/2010 | Chiu et al. | 257/98 |
| 7,829,905 B2* | 11/2010 | Huang et al. | 257/98 |
| 8,575,643 B2 | 11/2013 | Watanabe et al. | |
| 2002/0053872 A1 | 5/2002 | Yang et al. | |
| 2004/0041157 A1 | 3/2004 | Watanabe | |
| 2004/0211972 A1 | 10/2004 | Du et al. | |
| 2005/0062140 A1 | 3/2005 | Leung et al. | |
| 2005/0087884 A1 | 4/2005 | Stokes et al. | |
| 2005/0167682 A1 | 8/2005 | Fukasawa | |
| 2005/0189558 A1 | 9/2005 | Liu | |
| 2005/0236632 A1 | 10/2005 | Lai et al. | |
| 2005/0269582 A1* | 12/2005 | Mueller et al. | 257/94 |
| 2005/0280352 A1 | 12/2005 | Lai | |
| 2006/0011935 A1 | 1/2006 | Krames et al. | |
| 2006/0054919 A1 | 3/2006 | Matsuda et al. | |
| 2006/0055309 A1 | 3/2006 | Ono et al. | |
| 2006/0091409 A1* | 5/2006 | Epler et al. | 257/95 |
| 2006/0105478 A1* | 5/2006 | Camras et al. | 438/22 |
| 2006/0163595 A1 | 7/2006 | Hsieh et al. | |
| 2006/0197094 A1 | 9/2006 | Sugawara | |
| 2007/0010035 A1 | 1/2007 | Liu et al. | |
| 2007/0057269 A1* | 3/2007 | Ueda | 257/98 |
| 2007/0158669 A1 | 7/2007 | Lee et al. | |
| 2007/0229995 A1 | 10/2007 | Kawato et al. | |
| 2007/0267646 A1* | 11/2007 | Wierer et al. | 257/98 |
| 2007/0284607 A1* | 12/2007 | Epler et al. | 257/103 |
| 2008/0102541 A1 | 5/2008 | Kang et al. | |
| 2008/0142820 A1 | 6/2008 | Edmond et al. | |
| 2008/0157108 A1* | 7/2008 | Yu et al. | 257/98 |
| 2008/0203410 A1 | 8/2008 | Brunner et al. | |
| 2008/0237619 A1 | 10/2008 | Epler et al. | |
| 2008/0293172 A1 | 11/2008 | Lee et al. | |
| 2009/0008661 A1* | 1/2009 | Arimitsu | 257/96 |
| 2009/0081821 A1 | 3/2009 | Aihara | |
| 2009/0267092 A1* | 10/2009 | Fukshima et al. | 257/98 |
| 2010/0019260 A1 | 1/2010 | Epler et al. | |
| 2010/0163895 A1* | 7/2010 | Horie | 257/98 |
| 2011/0062469 A1 | 3/2011 | Camras et al. | |

FOREIGN PATENT DOCUMENTS

| | | |
|---|---|---|
| EP | 1748499 A2 | 1/2007 |
| EP | 1995780 A1 | 11/2008 |
| JP | 7030209 A | 1/1995 |
| JP | 2001-345484 A | 12/2001 |
| JP | 2002-158373 | 5/2002 |
| JP | 2002-329684 A | 11/2002 |
| JP | 2004-146541 A | 5/2004 |
| JP | 3105430 U | 10/2004 |
| JP | 2004-319685 A | 11/2004 |
| JP | 2005-072585 A | 3/2005 |
| JP | 3108273 U | 4/2005 |
| JP | 2005-252253 | 9/2005 |
| JP | 2005-327786 A | 11/2005 |
| JP | 2006041479 A | 2/2006 |
| JP | 2006-093686 | 4/2006 |
| JP | 2006-147787 | 6/2006 |
| JP | 2007-150331 A | 6/2007 |
| JP | 2007288106 A | 11/2007 |
| JP | 2007-335879 | 12/2007 |
| JP | 2008-159708 A | 7/2008 |
| RU | 2207663 C2 | 6/2003 |
| WO | 2005093863 A1 | 10/2005 |
| WO | 2007063460 A1 | 6/2007 |
| WO | 2007091704 A1 | 8/2007 |
| WO | WO 2007091432 A1 * | 8/2007 |
| WO | 2008/096301 A1 | 8/2008 |

OTHER PUBLICATIONS

First Office Action, China Application No. 200980128853.0, dated Jun. 14, 2012, 12 pages.
First Office Action, Taiwan Application No. 098124585, dated Sep. 22, 2014, 11 pages.
JP Office Action, Application 2015-191125, LUM reference 2008P00357JP04, Jul. 12, 2016, 7 pps.
Office Action, Japan Application No. 2011-519263, dated Jun. 30, 2015, 23 pages.
Second Office Action, China Application No. 200980128853.0, dated Jan. 17, 2013, 8 pages.
Third Office Action, China Application No. 200980128853.0, dated May 29, 2013, 6 pages.
EPO as ISA, PCTIB2009/058065 filed Jul. 15, 2009, "International Search Report and Written Opinion", dated Oct. 29, 2009, 18 pages.
Final Office Action, Korea Application No. 10-2011-7004185, dated Jan. 24, 2016, 7 pages.
Fourth Office Action, China Application No. 200980128853,0, dated Jul. 29, 2015, 17 pages.
Grant Decision, China Application No. 200980128853.0, dated Mar. 23, 2016, 4 pages.
JP Office Action, Application 2015-003148, LUM reference 2008P00357JP, Jun. 7, 2016 4 pps.
Office Action—Appeal Decision, Japan Application No. 2011-519263, dated Jan. 19, 2016, 26 pages.
Office Action, Japan Application No, 2015-003148, dated Oct. 15, 2015, 6 pages.
Nakamura et al., "Introduction to Nitride Semiconductor Blue Lasers and Light Emitting Diodes," CRC Press, pp. 20-21 (2000).
Nakamura et al., "The Blue Laser Diode: The Complete Story," Second Revised and Enlarged Edition, Springer, pp. 47-88 (2000).
Yao et al. "Oxide and Nitride Semiconductors: Processing, Properties, and Applications," Springer, pp. 130-134 (2009).

* cited by examiner

SEMICONDUCTOR LIGHT EMITTING DEVICE INCLUDING A WINDOW LAYER AND A LIGHT-DIRECTING STRUCTURE

BACKGROUND

Description of Related Art

FIG. 1 illustrates a thin-film flip-chip semiconductor light-emitting device described in more detail in U.S. Pat. No. 7,256,483, which is incorporated herein by reference. As used herein, the term "GaN" may represent any III-N material.

The LED of FIG. 1 is grown on a growth substrate. Typically, a relatively thick (approx. 1-2 micron) undoped or n-type GaN layer is grown on a sapphire growth substrate using conventional techniques. Other substrates may also be used, such as SiC, Si, SiCOI, and ZnO. In the case of gallium-phosphide (III-P) LEDs, the growth substrate is typically GaAs or Ge. The relatively thick GaN layer typically includes a low temperature nucleation layer and one or more additional layers so as to provide a low-defect lattice structure for the n-type cladding layer and active layer. One or more n-type cladding layers 16 are then formed over the thick n-type layer, followed by an active layer 18, one or more p-type layers 20, including one or more cladding layers and a p-type contact layer.

Various techniques are used to gain electrical access to the n-layers. In a flip-chip example, such as the device shown in FIG. 1, portions of the p-layers and active layer are etched away to expose an n-layer for metallization. In this way the p contact and n contact are on the same side of the chip and can be directly electrically attached to the package substrate contact pads. Current from the n-metal contact initially flows laterally through the n-layer. In contrast, in a vertical injection (non-flip-chip) LED, an n-contact is formed on one side of the chip, and a p-contact is formed on the other side of the chip. An electrically insulating substrate is removed to expose the conductivity type layer that is buried, often an n-type layer. Electrical contact to one of the p or n-contacts is typically made with a wire bond or a metal bridge, and the other contact is directly bonded to a package substrate contact pad.

In the flip chip illustrated in FIG. 1, after etching to expose an n-type layer, the n- and p-contact metals 50 and 24 are formed. The n- and p-contacts 50 and 24 may include bonding metals, diffusion barriers, or other layers to protect the optical properties of the contact. The p-metallization 24 may be highly reflective to light emitted by the active layer. After the contacts are formed, a wafer of devices may be diced into individual devices.

The metallization layers are then bonded to metal contact pads 22 on the package substrate 12. The bond technology may be solder, thermocompression, interdiffusion, or a Au stud bump array bonded by an ultrasonic weld.

The package substrate 12 may be formed of the electrically insulating material AlN, with gold contact pads 22 connected to solderable electrodes 26 using vias 28 and/or metal traces. Alternatively, the package substrate 12 may be formed of a conducting material if passivated to prevent shorting, such as anodized AlSiC. The package substrate 12 may be thermally conductive to act as a heat sink or to conduct heat to a larger heat sink. Ultimately the LED may have a lens cap attached, or be coated with a phosphor (for converting blue or UV light to create a white light), or be further processed, and the package may be soldered to a printed circuit board, if appropriate for the particular application.

An underfill material 52 may be deposited in the voids beneath the LED to reduce thermal gradients across the LED, add mechanical strength to the attachment, and prevent contaminants from contacting the LED material.

After bonding the device to the package substrate, the growth substrate is removed by a technique appropriate to the substrate material; for example by laser lift-off, etching, or lapping. The semiconductor structure exposed by removing the substrate may be thinned, then optionally roughened or patterned. A phosphor material may be deposited over the LED die. For example, a ceramic phosphor slab may be attached to the LED die by an organic adhesive.

In the device illustrated in FIG. 1, many fabrication steps are performed after a wafer is diced into individual devices. Organic materials may be included in the device, for example as underfill or to attach the ceramic phosphor.

SUMMARY

Devices according to embodiments of the invention are fabricated by a process where most steps occur at a wafer level, before the wafer is diced into individual devices. The fabrication process may eliminate the need for organic materials.

In accordance with embodiments of the invention, a device includes a semiconductor structure comprising a light emitting layer disposed between an n-type region and a p-type region. The semiconductor structure is disposed between a window layer and a light-directing structure. The light-directing structure is configured to direct light toward the window layer; examples of suitable light-directing structures include a porous semiconductor layer and a photonic crystal. An n-contact is electrically connected to the n-type region and a p-contact is electrically connected to the p-type region. The p-contact is disposed in an opening formed in the semiconductor structure.

DETAILED DESCRIPTION

In some embodiments of the invention, a thin-film flip-chip semiconductor light-emitting device is fabricated in a series of wafer-level, rather than die-level, steps. Wafer-level fabrication may be more reliable and less time consuming than die-level fabrication. Also, embodiments of the invention also do not require organic materials. Eliminating organic materials eliminates problems associated with organic materials such as yellowing, and may increase the temperature at which the device may be fabricated or operated.

Figure 2:
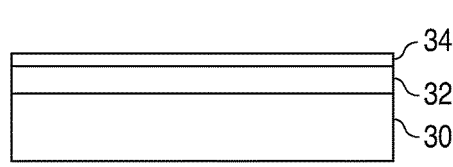
FIG. 2 is a cross sectional view of a portion of a device, including a semiconductor structure grown on a growth substrate.

FIGS. 2-5 show fabrication of a device according to embodiments of the invention. In FIG. 2, a semiconductor structure 32 is grown over a suitable growth substrate 30, often GaN, $Al_2O_3$ or SiC. Semiconductor structure 32 includes a light emitting or active region sandwiched between an n-type region and a p-type region. The n-type region is typically grown over the substrate before the p-type region.

The n-type region may include multiple layers of different compositions and dopant concentration including, for example, preparation layers such as buffer layers or nucleation layers which may be n-type or not intentionally doped, release layers designed to facilitate later release of the growth substrate or thinning of the semiconductor structure after substrate removal, and n- or even p-type device layers designed for particular optical or electrical properties desirable for the light emitting region to efficiently emit light.

The light emitting region is grown over the n-type region. Examples of suitable light emitting regions include a single thick or thin light emitting layer and a multiple quantum well light emitting region including multiple thin or thick quantum well light emitting layers separated by barrier layers. For example, a multiple quantum well light emitting region may include multiple InGaN light emitting layers separated by GaN or InGaN barriers. One or more light emitting layers in the device may be doped, for example with Si, or the light emitting layer or layers may be not intentionally doped.

The p-type region is grown over the light emitting region. Like the n-type region, the p-type region may include multiple layers of different composition, thickness, and dopant concentration, including layers that are not intentionally doped, or n-type layers.

An electrically conductive bonding layer 34 is formed over the top layer of semiconductor structure 32, generally the p-type region, using a conventional thin-film deposition technique such as vacuum evaporation, sputtering, and electron beam deposition, which may be followed by annealing in air. Suitable materials for conductive bonding layer 34 are minimally optically absorbing at the wavelength emitted by the light emitting layers of the semiconductor structure, are conductive enough to not significantly add to the series resistance of the device, and form an ohmic contact with the top layer of semiconductor structure 32. Suitable materials include, for example, transparent conductive oxides such as indium tin oxide (ITO), zinc oxide, and ruthenium oxide. Bonding layer 34 may be, for example, between 200 nm and 1 μm thick in some embodiments, and about 500 nm thick in some embodiments. In some embodiments, bonding layer 34 is a thick, transparent, conductive layer, such as a spin-on or sol-gel material. In some embodiments, bonding layer 34 has an index of refraction that is close to the index of semiconductor structure 32 or window layer 40. In embodiments where the index of refraction of any bonding layer is low, the power transmission may be improved by random or patterned structuring of the interface between the high index and low index materials.

Figure 3:
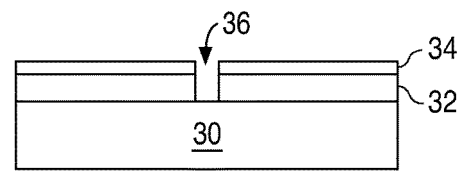
FIG. 3 is a cross sectional view of the structure of FIG. 2 after etching trenches through the bonding layer and semiconductor structure.

One or more trenches 36 are etched through bonding layer 34 and semiconductor structure 32, fully or partially down to growth substrate 30, as illustrated in FIG. 3. Trenches 36 may define the boundaries of individual devices. Trenches 34 are formed by conventional patterning and etching steps.

Figure 4:
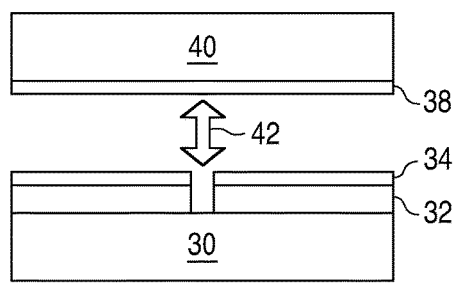
FIG. 4 illustrates bonding a semiconductor light emitting device to a window layer.

In FIG. 4, the structure illustrated in FIG. 3 is bonded to a window layer. Window layer 40 may be, for example, a wavelength converting structure such as a ceramic phosphor, a suitable transparent substrate or carrier such as a sapphire or glass layer, or a filter such as a distributed Bragg reflector, for modifying the spectrum to provide a desired color such as amber for signal lights. Ceramic phosphors are described in more detail in U.S. Pat. No. 7,361,938, which is incorporated herein by reference. Window layer 40 is preferably thick enough to permit wafer level handling of the window layer/semiconductor structure combination after the growth substrate is removed. Window layer 40 may be between 80 μm and 1 mm thick in some embodiments, between 100 μm and 500 μm thick in some embodiments, and between 100 μm and 200 μm thick in some embodiments.

If conductive bonding layer 34 and window layer 40 are not suitable for bonding, prior to bonding a transparent bonding layer 38 is formed on window layer 40 or on conductive bonding layer 34. Bonding layer 38 may be the same material as bonding layer 34, though it need not be. Bonding layer 38 may be a transparent conductive oxide, a non-conducting glass material, or other dielectric material such as silicon nitride. For example, bonding layer 38 may be an ITO layer, soda-lime glass, borosilicate, or other glass-like layer with a thickness between 200 nm and 1 μm thick, often with a thickness of about 500 nm. Alternatively, bonding layer 38 may be a transparent organic material such as benzocyclobutene (BCB), spin-on glass, or silicone. A wavelength converting material such as a phosphor may be disposed in bonding layer 38. For example, a red-emitting phosphor may be disposed in bonding layer 38, and a yellow- or green-emitting phosphor such as cerium-doped yttrium aluminum garnet may be disposed in or on window layer 40, such that the composite light emitted from the device appears warm white. Alternatively, a mixture of phosphors may be disposed in a silicone bonding layer 38, to provide the desired spectrum. In such devices, window layer 40 may be transparent. In some embodiments, bonding layer 38 is patterned or roughened, which may increase light extraction from the device. In some embodiments, an interface between the additional transparent bonding layer 38 and the transparent conductive oxide bonding layer 34 is adapted to scatter light. Other suitable bonding materials are described in Published U.S. patent application No. 2006-0105478, titled "Bonding an Optical Element to a Light Emitting Device," and incorporated herein by reference. In some embodiments, bonding layer 38 is quite thin, for example on the order of tens of angstroms thick. Such a bonding layer 38 may serve as a surface modifier for either the conductive bonding layer 34 or the window layer 40, or both. This bonding layer may be transparent as-deposited or may be a non-transparent layer that is chemically reacted to both bond the layers together and become transparent. Examples of suitable thin bonding layers include thin metal layers that may be diffused thermally to bond to an ITO bonding layer 34 and thin silicon oxide bonding layer 38, or that may be bonded using oxide-to-oxide bonding techniques.

Bonding layers 34 and 38 are bonded, as shown by arrow 42 in FIG. 4, for example by anodic bonding, direct bonding via plasma preparation of hydrophilic surfaces, or bonding via use of an intermediate bonding layer.

Figure 5:
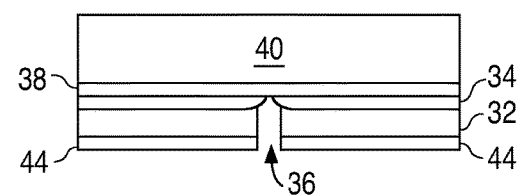
FIG. 5 illustrates the bonded structure resulting from FIG. 4, after removing the growth substrate and forming a porous region.

Growth substrate 30 is removed by a process appropriate to the substrate material, as illustrated in FIG. 5. A sapphire substrate can be removed by laser lift off. Substrates may be removed by etching, grinding, or lift off by etching away a sacrificial layer. The bottom surface of the n-type region is exposed by removing the substrate. The n-type region may be thinned, for example by photoelectrochemical etching, to remove unwanted material or material damaged by substrate removal.

The rays of light generated by the light emitting layer are approximately isotropically distributed and many rays will not escape from the semiconductor into the bonding layer(s). These rays are redirected by making a part of the remaining thickness of the n-type region of semiconductor structure 32 porous, as illustrated in FIG. 5. Porous region 44 is generally electrically and thermally conducting, and designed to scatter light toward window layer 40, and away from a later-formed n-contact. The amount of scattering is determined by the thickness and porosity of the porous layer. The porous layer generally has a thickness between 0.5 and 40 microns. The porous layer may have a porosity between 5% and 80% and often has a porosity between 20% and 40%. The porosity is limited on the lower end by the ability of the porous layer to scatter light and on the upper end by the resistivity and mechanical stability of the porous layer. Suitable porosity may be related to the thickness of the porous region. In order to provide the same amount of scattering, a thicker porous region may be less porous than a thinner porous region. The light rays reflected and scattered by a porous layer will have a Lambertian radiation pattern with maximum intensity directed perpendicular to surface.

Porous layer 44 may be formed by a two step process. In the first step, the pores are created by an electrochemical anodic etch. In this step, the depth of the porous region is determined. In the second step, the pores are enlarged by a photochemical anodic etch until the desired porosity is reached. A porous layer may be formed as follows: the wafer is connected to a copper plate by, for example, silver paste. A material such as Teflon isolates the portion of the wafer that is to be made porous. The wafer is exposed to a suitable electrolyte such as 0.5 M $H_2SO_4$ as the working electrode in a standard electrochemical cell, with a Saturated Calomel Electrode (SCE) as reference and a platinum counter electrode. The cell is controlled by a potentiostat. Application of a strong positive potential (15 V SCE) causes etching of submicron pits at surface defects, on the order of microns apart. These pits serve as the starting points for the etching of the sub-surface network of tunnel-like structures. The etching primarily occurs at the end of the tunnels such that the network grows deeper but the tunnels do not enlarge and merge. The amount of material removed is primarily a function of the time-integrated current density, although the etchant solution, bias voltage, and substrate doping influence the pore density and size. The resulting depth of the porous structure is a function of all these variables.

In one example of a photochemical anodic etching second step, the electrochemically etched wafer is exposed to an $H_2O:H_2SO_4:H_2O_2$ electrolyte using 50 mW/cm$^2$ of sub-bandgap light from a Xe lamp, under an applied positive potential of 2 V SCE. The applied potential is too low for the above-described anodic etching process to take place and the sub-bandgap light is only absorbed at the electrolyte-semiconductor interface, so the primary effect is to increase the porosity of the layer defined in step one. The degree of porosity is determined by the time-integrated current density which is a function of light intensity, etchant concentrations and substrate parameters. Any suitable semiconductor material may be made porous by the process described above, such as Si, GaN, SiC, and GaP. Binary materials such as GaP and GaN are attractive candidates for porous regions, though ternary and quaternary III-phosphide and III-nitride materials may also be made porous. The conductivity type and dopant concentration in the semiconductor material may influence the characteristics of the porous layer, for example by influencing the size and spacing of the pores formed. In some embodiments, the porous region is formed from an n-type GaN layer that is doped with a dopant concentration between zero (not intentionally doped) and $10^{19}$ cm$^{-3}$.

Any structure that redirects light toward window layer 40 may be substituted for porous region 44. For example, rather than being made porous, the surface of the n-type region exposed by removing the substrate may be roughened, or textured with, for example, a photonic crystal structure. Alternatively, porous region 44 may be replaced by a reflective material, such as a reflective metal or coating.

Figure 6:
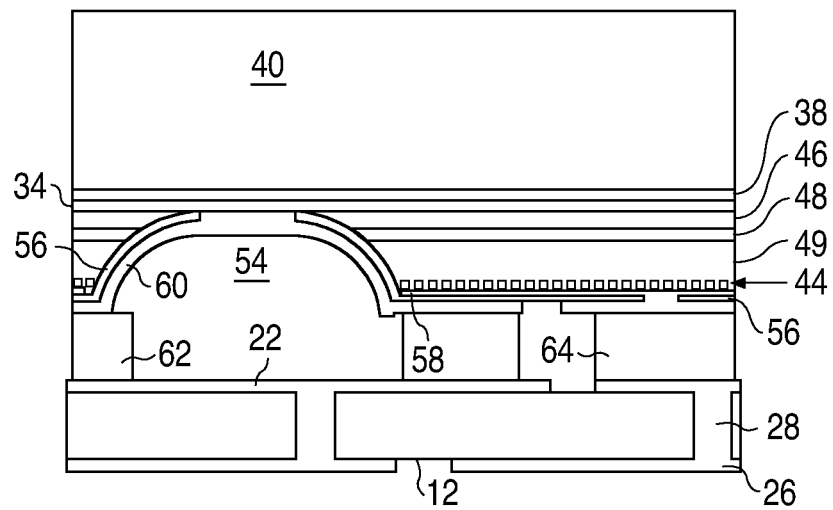
FIG. 6 illustrates a semiconductor light emitting device connected to a mount.

One or more openings which expose bonding layer 34 are etched through the semiconductor structure, then contacts are formed, and the wafer is singulated into individual devices. A finished device, attached to a mount, is illustrated in FIG. 6. An opening 54 is etched through porous region 44, non-porous n-type region 49, light emitting region 48, and p-type region 46 to expose conductive bonding layer 34. Conductive bonding layer 34 serves as the electrical contact to the p-type region. N-contact metal 58 is formed on the remaining part of porous region 44, and p-contact metal 60 is formed on the exposed portion of conductive bonding layer 34. N- and p-contact metals 58 and 60 may be electrically isolated by dielectric layer 56.

The device may be attached to any suitable surface. The device illustrated in FIG. 6 is mounted on a mount 12, which may be similar to the package substrate described above in the background section text accompanying FIG. 1. N- and p-interconnects 64 and 62 connect the n- and p- contacts 58 and 60 on the device to contacts 22 on mount 12. Top-side contacts 22 on mount 12 are connected to bottom-side contacts 26 by, for example, conductive pillars 28. Interconnects may be, for example, elemental metals, solder, metal alloys, semiconductor-metal alloys, thermally and electrically conductive pastes or compounds such as epoxy, eutectic joints between dissimilar metals such as Pd—In—Pd, or Au stud bumps.

Devices according to embodiments of the invention may have several advantages. In the device described in the background section and FIG. 1, many fabrication steps are die-level steps; that is, they are performed after dicing a wafer into individual devices. For example, attaching the device to a package substrate, underfilling the device, removing the growth substrate, thinning or texturing the exposed semiconductor surface, and placing a phosphor material over the device are die-level steps. Die-level steps can be time consuming and difficult to control, such as, for example, placing each die correctly on the package substrate and dispensing the correct amount of underfill in the proper place. In some embodiments of the invention, nearly all fabrication steps are wafer-level steps, not die-level steps. Wafer-level steps may be less time consuming and easier to control than die-level steps.

The device described in the background section may include organic materials, for example as an underfill to support the LED die during substrate removal, or as an adhesive to attach a ceramic phosphor layer to the device. Organic materials are problematic because they can degrade when exposed to heat and light, which can limit the temperature at which the device can be operated, or undesirably change the color point of light emitted from the device. Devices according to embodiments of the invention do not require organic underfill materials or adhesives.

In addition, an organic adhesive layer that attaches a ceramic phosphor to the LED die in the device described in the background section may be as thick as 10-15 µm. The thick adhesive can direct a significant amount of light out the side of the device, rather than the top of the device, the preferred surface for light to exit the device. Excessive sidelight can negatively impact the color uniformity and color point of light exiting the device. In embodiments of the invention, the bond between the LED die and the window layer is as thin as 1 µm, which may significantly reduce the amount of side light emitted from the device. Also, some bond materials such as ITO may conduct heat generated in a ceramic phosphor window layer through the LED die to the mounting surface more efficiently than an organic adhesive conducts heat.

Figure 7:
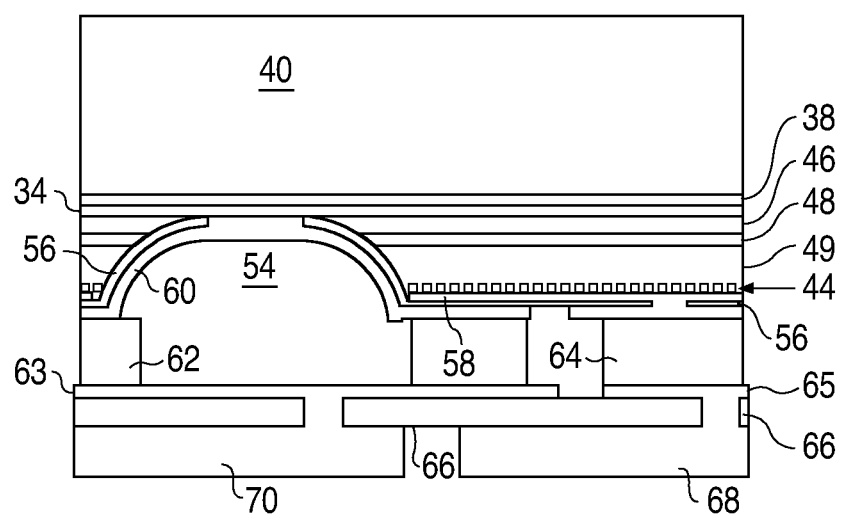
FIG. 7 illustrates a semiconductor light emitting device with large area contacts formed on a stack of metal and dielectric layers.

In the device described in the background section, the package substrate is necessary to prevent damage to the semiconductor device during substrate removal. Since window layer 40 provides mechanical support to the semiconductor structure during and after removal of the growth substrate, a package substrate or other mount is not required. FIG. 7 illustrates a device without a package substrate. The n- and p-contacts 58 and 60 formed on the semiconductor structure are redistributed to large area contacts 68 and 70 by one or more dielectric layers 56 and 66, bonding metal layers 63 and 65, and conductive interconnects 62 and 64. Dielectric layers 56 and 66 may be, for example, $SiN_x$. Interconnects 62 and 64 are described above in the text accompanying FIG. 6. Bonding metal layers 63 and 65 may be, for example, an Al/Ni/Au alloy. Large area contacts 68 and 70 may be, for example, gold.

Figure 1:
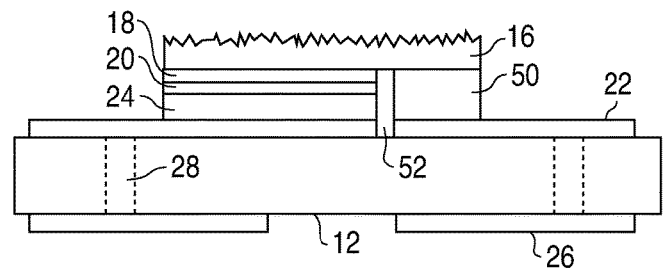
FIG. 1 is a cross sectional view of a thin film flip chip semiconductor light emitting device.

In the device illustrated in FIG. 1, p-type region 20, which is disposed between the active region 18 and reflective p-contact 24, is thin, which may reduce the efficiency of the device by introducing undesirable cavity resonances. In embodiments of the invention, the non-porous n-type region 49 is thicker than p-type region 20, thus no cavity resonances are created. Elimination or reduction of cavity resonances may relax limitations on the thickness of the semiconductor between the active region and the reflective contact, and may permit the active region to be grown thicker, have thicker layers, or have more layers.

In some embodiments, a ceramic phosphor window layer 40 is color matched to a semiconductor wafer prior to bonding. The color point of light emitted by a particular ceramic phosphor window layer/semiconductor wafer combination may be adjusted by laser trimming of the ceramic phosphor before or after bonding the window layer to the semiconductor wafer.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

What is being claimed is:

1. A device comprising:
   a window layer;
   a light-directing structure comprising a porous semiconductor layer formed in an n-type region, the light-directing structure configured to direct light toward the window layer;
   a semiconductor structure, disposed between the window layer and the light-directing structure, comprising a light emitting layer disposed between the n-type region and a p-type region;
   an opening formed in the semiconductor structure;
   a first metal layer in direct contact with the light-directing structure;
   a dielectric layer disposed over a first portion of the first metal layer and in the opening;
   a second metal layer disposed over the dielectric layer;
   a transparent conductive oxide disposed between the p-type region and the window layer and in direct contact with the p-type region;
   a first hole formed in the dielectric layer, wherein the first hole exposes the transparent conductive oxide such that the second metal layer is in direct contact with the transparent conductive oxide through the first hole; and
   a second hole formed in the dielectric layer, such that a second portion of the first metal layer is over the dielectric layer and in direct contact with the first portion of the first metal layer in the second hole.

2. The device of claim 1 wherein the transparent conductive oxide is one of indium tin oxide, zinc oxide, and ruthenium oxide.

3. The device of claim 1 wherein a combined thickness of all layers disposed between the p-type region and the window layer is less than 2 µm.

4. The device of claim 1 wherein the second metal layer is disposed in direct contact with the transparent conductive oxide in the opening etched through the semiconductor structure to expose the transparent conductive oxide.

5. The device of claim 1 further comprising an additional transparent bonding layer disposed between the transparent conductive oxide and the window layer.

6. The device of claim 5 further comprising a wavelength converting material disposed in the additional transparent bonding layer.

7. The device of claim 5 wherein an interface between the additional transparent bonding layer and the transparent conductive oxide is adapted to scatter light.

8. The device of claim 5 wherein the additional transparent bonding layer is one of a transparent conductive oxide, a non-conducting glass material, a dielectric material, silicon nitride, ITO, soda-lime glass, borosilicate glass, an organic material, benzocyclobutene, spin-on glass, and silicone.

9. The device of claim 1 wherein a bond between the window layer and the p-type region is substantially free of organic material.

10. The device of claim 1 wherein the window layer is one of an optical filter, sapphire, and glass.

11. The device of claim 1 wherein the window layer comprises a wavelength converting material configured to absorb light emitted by the light emitting layer and emit light of a different wavelength.

12. The device of claim 1 wherein the window layer comprises a ceramic phosphor.

13. The device of claim 1 wherein the light emitting layer is a III-nitride layer.

14. The device of claim 1 wherein the semiconductor structure is disposed on at least two sides of the opening.

* * * * *